United States Patent
Hachiya et al.

(10) Patent No.: US 11,262,136 B2
(45) Date of Patent: Mar. 1, 2022

(54) PHASE CHANGE COOLING SYSTEM AND ELECTRONIC DEVICE

(71) Applicant: NEC CORPORATION, Tokyo (JP)

(72) Inventors: Mahiro Hachiya, Tokyo (JP); Masaki Chiba, Tokyo (JP)

(73) Assignee: NEC CORPORATION, Tokyo (JP)

( * ) Notice: Subject to any disclaimer, the term of this patent is extended or adjusted under 35 U.S.C. 154(b) by 71 days.

(21) Appl. No.: 16/089,233

(22) PCT Filed: Mar. 23, 2017

(86) PCT No.: PCT/JP2017/011801
§ 371 (c)(1),
(2) Date: Sep. 27, 2018

(87) PCT Pub. No.: WO2017/170153
PCT Pub. Date: Oct. 5, 2017

(65) Prior Publication Data
US 2019/0113287 A1 Apr. 18, 2019

(30) Foreign Application Priority Data

Mar. 31, 2016 (JP) ............................. JP2016-70147

(51) Int. Cl.
*F28D 15/02* (2006.01)
*H01L 23/427* (2006.01)
(Continued)

(52) U.S. Cl.
CPC ....... *F28D 15/025* (2013.01); *F28D 15/0266* (2013.01); *H01L 23/427* (2013.01);
(Continued)

(58) Field of Classification Search
CPC ............... F28D 15/0266; F28D 15/025; F28D 15/0275; H01L 23/427; H05K 7/20309; H05K 7/20336
(Continued)

(56) References Cited

U.S. PATENT DOCUMENTS 3,986,550 A * 10/1976 Mitsuoka ............... F28D 15/025
165/104.21
5,168,919 A * 12/1992 Berenholz ........... F28D 15/0233
165/104.33
(Continued)

FOREIGN PATENT DOCUMENTS

DE 10053258 A1 * 5/2002 ........... H01L 23/427
DE 202004004016 U1 * 5/2004 ............... G06F 1/20
(Continued)

OTHER PUBLICATIONS

International Search Report for PCT/JP2017/011801 dated May 30, 2017.

*Primary Examiner* — Jianying C Atkisson
*Assistant Examiner* — For K Ling
(74) *Attorney, Agent, or Firm* — Sughrue Mion, PLLC

(57) ABSTRACT

Provided are a phase change cooler with enhanced cooling performance and enhanced pressure resistance performance, and an electronic device using such a phase change cooler. The phase change cooler includes a heat receiving unit, a heat dissipating unit, a vapor pipe and a liquid pipe that interconnect the heat receiving unit and the heat dissipating unit to form a loop, and refrigerant encapsulated inside the phase change cooler. The heat receiving unit has an approximately semicircular cross section, and the vapor pipe is coupled to an inclined face of the heat receiving unit.

9 Claims, 11 Drawing Sheets

(51) Int. Cl.
*H05K 7/20* (2006.01)
*F28D 21/00* (2006.01)

(52) U.S. Cl.
CPC . *H05K 7/20672* (2013.01); *F28D 2015/0216* (2013.01); *F28D 2021/0028* (2013.01); *F28D 2021/0029* (2013.01); *F28D 2021/0031* (2013.01)

(58) Field of Classification Search
USPC .......... 165/104.21, 104.26, 104.33; 361/700
See application file for complete search history.

(56) References Cited

U.S. PATENT DOCUMENTS

| | | | | |
|---|---|---|---|---|
| 5,737,923 A | * | 4/1998 | Gilley | F28F 13/187 62/3.7 |
| 5,924,481 A | * | 7/1999 | Tajima | F28D 15/0266 165/104.21 |
| 7,104,078 B2 | * | 9/2006 | Tilton | F25B 39/02 257/E23.1 |
| 7,885,074 B2 | * | 2/2011 | Campbell | H01L 23/427 361/700 |
| 7,926,553 B2 | * | 4/2011 | Dautert | F28D 15/0266 165/104.14 |
| 7,958,935 B2 | * | 6/2011 | Bel | F28D 15/0266 165/104.21 |
| 2006/0185825 A1 | | 8/2006 | Chen et al. | |
| 2007/0163754 A1 | * | 7/2007 | Dionne | F28D 15/06 165/104.21 |
| 2008/0236790 A1 | * | 10/2008 | Bhatti | F28F 1/126 165/80.3 |
| 2010/0071880 A1 | * | 3/2010 | Kim | F28D 15/0266 165/104.26 |
| 2010/0101756 A1 | * | 4/2010 | Chu | H01L 23/427 165/80.3 |
| 2011/0192574 A1 | * | 8/2011 | Yoshikawa | F28D 15/0266 165/104.21 |
| 2011/0214840 A1 | * | 9/2011 | Sakamoto | H01L 23/427 165/104.21 |
| 2014/0311176 A1 | | 10/2014 | Meng et al. | |
| 2015/0016123 A1 | | 1/2015 | Musser et al. | |

FOREIGN PATENT DOCUMENTS

| | | | | |
|---|---|---|---|---|
| JP | 63-93138 A | | 4/1988 | |
| JP | 03190153 A | * | 8/1991 | |
| JP | 2001-041666 A | | 2/2001 | |
| JP | 2005-042949 A | | 2/2005 | |
| JP | 5210997 B2 | | 6/2013 | |
| JP | 2014-074568 A | | 4/2014 | |
| JP | 2014074568 A | * | 4/2014 | ......... F28D 15/0266 |
| JP | 2014-212293 A | | 11/2014 | |
| JP | 2015-019076 A | | 1/2015 | |
| JP | 2015-163831 A | | 9/2015 | |
| WO | 2010/050129 A1 | | 5/2010 | |

* cited by examiner

PHASE CHANGE COOLING SYSTEM AND ELECTRONIC DEVICE

CROSS REFERENCE TO RELATED APPLICATIONS

This application is a National Stage of International Application No. PCT/JP2017/011801 filed Mar. 23, 2017, claiming priority based on Japanese Patent Application No. 2016-70147 filed Mar. 31, 2016, the disclosure of which is incorporated herein in its entirety by reference.

TECHNICAL FIELD

The present invention relates to a phase change cooling system and an electronic device, and more particularly to a phase change cooling system that performs cooling through natural circulations of coolant using a phase change phenomenon, and an electronic device mounting such a phase change cooling system.

BACKGROUND ART

With the evolution of communication infrastructures, an information processing amount has been increased, whereas the downsizing of an electronic device has been advanced because of the advancement of process techniques. As a result of such circumstances, a significantly larger amount of heat generation and higher density mounting with respect to heat generating objects mounted in such an electronic device have been progressing, and recently, phase change cooling has been attracting attention as a highly efficient cooling technique.

In such phase change cooling, a cooling system is divided into a heat receiving unit and a heat dissipating unit, and these units are coupled to each other so as to form a loop using a vapor pipe and a liquid pipe. Coolant is encapsulated inside the cooling system, and in the heat receiving unit, heat transport is performed utilizing a vapor-liquid phase change phenomenon in which, in the heat receiving unit, coolant liquid evaporates by receiving heat from heat generating objects, and in the heat dissipating unit, coolant vapor condenses by dissipating the heat to cooling wind. Further, cooling is performed utilizing a property in which liquid temperature is kept to a boiling point while coolant liquid continues to evaporate.

In the heat receiving unit, a jacket or the like is used, and is disposed immediately above the heat generating objects. Further, in the heat dissipating unit, a radiator or the like is used, and is disposed at a place far from the heat generating objects. Even though the heating objects are mounted with a high density and are disposed in a narrow space inside the electronic device, the heat dissipating unit can be disposed in a relatively broad space inside the electronic device, and thus, securing of a heat dissipation area is facilitated, as compared with air cooling.

Further, latent heat at the time of the vapor-liquid phase change of coolant is utilized, and thus, a heat transport ability is high, as compared with water cooling, thus enabling electric power for a cooling fan to be reduced. In the case of a thermo syphon-type phase change cooling system, natural circulations of the coolant are performed utilizing a vapor-liquid density difference and the gravity, and thus, electric power for an external driving source, such as a pump or the like, can be reduced.

Patent literature 1 (PTL1) relates to a cooling system utilizing a thermo syphon. In the cooling system in PTL1, as illustrated in FIG. 11, heat having been generated in a heat generation source is transferred to a heat receiving jacket 10; water (Wa) as liquid coolant is evaporated by the transferred heat; and steam (ST) is generated. The generated steam (ST) is guided from the heat receiving jacket 10 to a condenser 12 through a pipe 11. In the condenser 12, the coolant steam is cooled into liquid by air sent by a cooling fan 13, and the liquid is returned to the above heat receiving jacket 10 again through a pipe 14.

In the cooling system in PTL1, the pipe 11 and the pipe 14 are approximately perpendicularly coupled to a top face and a side face of the heat receiving jacket 10, respectively. Further, the other end of the pipe 11 and the other end of the pipe 14 are coupled to an upper portion and a lower portion of the condenser 12, respectively, thereby causing a coolant flow path to be formed in the form of a loop. Further, in the cooling system in PTL1, the pipe 11, which guides the generated steam (ST) from the heat receiving jacket 10 to the condenser 12, is caused to bend at an angle of approximately 90 degrees.

Patent literature 2 (PTL2) relates to a boiling cooling apparatus that circulates coolant utilizing a vapor-liquid phase change phenomenon, and it is proposed that a cover portion of a heat receiving unit is formed into a truncated circular-cone shape or a truncated pyramid shape, and a vapor pipe is perpendicularly drawn from the top of the heat receiving unit. In PTL2, there are descriptions, such as a description that coolant boils inside the heat receiving unit and vapor having been generated thereby moves toward exit for a direction of the vapor pipe; a description that the heat receiving unit is formed in such a way that a flow path of the vapor is gradually narrowed toward the vapor pipe; and a description that the vapor pipe has an opening at a position immediately above a heat generating element. In PTL2, with this structure, the generated vapor in the heat receiving unit can be guided into the vapor pipe with low resistance because the force of the flow of boiling bubbles is effectively utilized.

Patent literature 3 (PTL3) relates to a cooling apparatus that cools a plurality of semiconductors as examples of heat generating objects, and it is proposed that each of the heat generating objects is cooled by forming a circulation path for coolant that is flown via the plurality of semiconductors, and allowing the coolant to circulate using one pump. In PTL3, it is proposed that a configuration is made in which a heat receiver has a space that is gradually spread in a horizontal direction during a course up to a middle portion between a coolant inlet and a coolant outlet by forming a protruding portion in an top face plate of the heat receiver, and the heat receiver has a space that is gradually narrowed in the horizontal direction during a course from the middle portion up to the coolant outlet. In PTL3, it is described that, by employing the above configuration having such spaces, coolant having been vaporized in a vaporizing portion is smoothly frown out from the vaporizing portion to the coolant outlet, and as a result of this smooth flow-out, the speed of the coolant flown in the vaporizing portion becomes faster, thereby allowing the cooling efficiency to be enhanced.

CITATION LIST

Patent Literature

[PTL1] Japanese Patent No. 5210997
[PTL2] Japanese Laid-open Patent Application No. 2015-19076
[PTL3] Japanese Laid-open Patent Application No. 2015-163831

SUMMARY OF INVENTION

Technical Problem

In the above-described cooling apparatus in Background Art, however, there are disadvantages described below in cooling performance in the case where a heat dissipation amount of a cooling system has been increased.

The phase change cooling performs cooling utilizing a property in which liquid temperature is kept to a boiling point while coolant liquid continues to evaporate. Here, the boiling point of the coolant has a positive correlation with the inner pressure of a heat receiving unit, and is represented by a coolant vapor-pressure curved line. For example, a coolant vapor-pressure curved line in the case of water is illustrated in FIG. 10.

In general, a boiling point Tv [° C.] of coolant liquid is represented by the following formula (1) using a cooling wind temperature Ta [° C.], a heat dissipating portion thermal resistance Rva [° C./W], and a heat dissipation amount Q [W] of cooling system.

$$Tv = Ta + Rva \times Q \quad \text{Formula (1)}$$

When the above proportional relation is taken into consideration, the inner pressure of the heat generating portion increases due to the pressure loss of a coolant flow path, and thus, it is necessary to modify the formula (1) into the following formula (1)' by adding a term of a boiling point increase represented by $\Delta Tv(P)$ [° C.], which occurs along with the increase of the inner pressure, to the formula (1).

$$Tv = Ta + Rva \times Q + \Delta Tv(P) \quad \text{Formula (1)'}$$

In such structures described in PTL1, PTL2, and PTL3, the vapor pipe is caused to bend at an angle of 90 degrees, and thus, at this portion, a local pressure loss coefficient is increased. Further, in PTL1, a thin vapor pipe is coupled to the top face of the heat receiving jacket 10, which is a relatively broad face. For this reason, sudden shrinking is deemed to occur at the time when the vapor moves from the heat receiving unit to the vapor pipe, and a local pressure loss coefficient at this portion is also increased.

A local pressure loss $\Delta P$ [Pa] at a certain portion of a coolant flow path is represented by the following formula (2) using a coolant flow speed $v(Q)$ [m/s], a coolant density $\rho$ [kg/m³], and a local pressure loss coefficient $\xi$ [-].

$$\Delta P = \xi \times \rho \times v(Q)^2 \div 2 \quad \text{Formula (2)}$$

Here, as described above, the significantly larger amount of heat generation with respect to heat generating objects mounted in an electronic has been progressing. Further, simultaneously, the higher density mounting has been progressing, and a plurality of heat generating objects are sometimes secured to one heat receiving unit. As a result of such circumstances, the amount of heat generation with respect to a cooling system has rapidly increased, and proportionally thereto, the flow speed of the coolant circulating inside the cooling system has become faster. Thus, in the structure having a large local pressure loss coefficient, such as those in PTL1, PTL2, and PTL3, the pressure loss of the coolant flow path significantly increases. As a result of this phenomenon, the inner pressure of the heat receiving unit increases, and the boiling point of the coolant increases along with the increase of the inner pressure, thus causing the cooling performance to be degraded.

An object of the present invention is to provide a phase change cooling system with enhanced cooling performance and enhanced pressure resistance performance, and an electronic device using such a phase change cooling system.

Solution to Problem

To achieve the above-mentioned object, a phase change cooling system according to the present invention comprises: a heat receiving unit; a heat dissipating unit; a vapor pipe and a liquid pipe that interconnect the heat receiving unit and the heat dissipating unit to form a loop; and coolant encapsulated inside the phase change cooling system, wherein the heat receiving unit has an approximately semicircular or an approximately circular cross section, and the vapor pipe is coupled to an inclined face of the heat receiving unit.

An electronic device according to the present invention includes a phase change cooling system, wherein the phase change cooling system comprises: a heat receiving unit; a heat dissipating unit; a vapor pipe and a liquid pipe that interconnect the heat receiving unit and the heat dissipating unit to form a loop; and coolant encapsulated inside the phase change cooling system, and wherein the heat receiving unit of the phase change cooling system has an approximately semicircular or an approximately circular cross section, and the vapor pipe of the phase change cooling system is coupled to an inclined face of the heat receiving unit.

Advantageous Effect of Invention

The present invention enables a phase change cooling system with enhanced cooling performance and enhanced pressure resistance performance to be achieved.

EXAMPLE EMBODIMENT

Figure 1A:
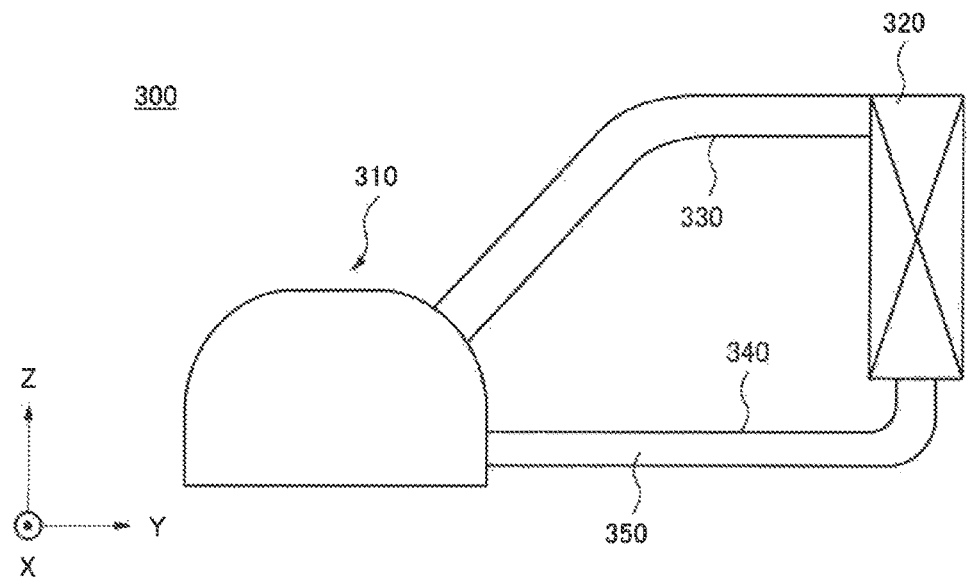
FIG. 1A is a conceptual diagram of a phase change cooling system according to a first example embodiment of the present invention.

Preferable example embodiments of the present invention will be described in detail referring to the drawings. An "inclined face" in the present description is defined to indicate a face that is neither a vertical direction face nor a horizontal direction face. A term "obliquely" in the present description is defined to indicate a direction that is neither the vertical direction nor the horizontal direction, or an angle that is neither a vertical direction angle nor a horizontal direction angle. In the following description, the vertical direction is defined to correspond to a Z-axis; a direction from a heat receiving unit toward a heat dissipating unit within a horizontal plane is defined to correspond to a Y-axis; and a direction orthogonal to each of the Y-axis and the Z-axis is defined to correspond to an X-axis.

[High-Level Conceptual Example Embodiment of the Present Invention]

Before the description of specific example embodiments of the present invention, a high-level conceptual example embodiment of the present invention will be described. A phase change cooling system according to the present example embodiment includes a heat receiving unit, a heat dissipating unit, and a vapor pipe and a liquid pipe that interconnect the heat receiving unit and the heat dissipating unit to form a loop. The heat receiving unit of the phase change cooling system has an approximately (semi)circular shape or an approximately polygonal shape. Further, it is a feature that the vapor pipe of the phase change cooling system is coupled to an inclined face of the heat receiving unit.

By coupling the vapor pipe of the phase change cooling system to the inclined face of the heat receiving unit, the bending angle of the vapor pipe can be reduced to smaller than the angle of approximately 90 degrees in the structures of Background Art. Further, as a result of the reduction of the bending angle of the vapor pipe, even in the case of the same cooling system size, the vapor pipe can be made thick in a state in which a curvature is maintained, and thus, the flow speed of the coolant becomes slow. With this configuration, the pressure loss at the time when the coolant vapor passes through the vapor pipe can be reduced. As a result of the formation of the cross section of the heat receiving unit into the approximately (semi)circular shape or the approximately polygonal shape, the flow path of the vapor is gently reduced toward the vapor pipe from the heat receiving unit. Further, as described above, since the radius of the vapor pipe can be made thick, the reduction ratio becomes further gentle, and the flow speed of the coolant becomes slower. With these configurations, the pressure loss at the time when the coolant vapor is flown into the vapor pipe can be also reduced. With the above configurations, since the pressure loss of the entire cooling system can be made small, the boiling point elevation can be reduced and the cooling performance can be enhanced. Further, as a result of the formation of the cross section of the heat receiving unit into the approximately (semi)circular shape or the approximately polygonal shape, a face perpendicularly opposite to the wind direction of cooling wind is reduced, and ventilation resistance is decreased. With this configuration, even in the case of the same cooling-fan electric power, the air volume increases, and thus, the cooling performance can be further enhanced.

As described above, since the boiling point elevation of the coolant liquid is reduced, the inner pressure of the heat receiving unit of the phase change cooling system can be decreased. Moreover, by forming the cross section of the heat receiving unit into the approximately (semi)circular shape or the approximately polygonal shape, the jacket of the heat receiving unit is allowed to have a curved face, and the area of one face is made narrow. With this configuration, the pressure applied to the plate material of the jacket of the heat receiving unit is dispersed, and thus, even in the case where the plate thickness remains the same, the equivalent stress can be reduced to equal to or less than the half. With the above configurations, the pressure resistance performance of the heat receiving unit can be enhanced. More specific example embodiments will be described below.

First Example Embodiment

Figure 1B:
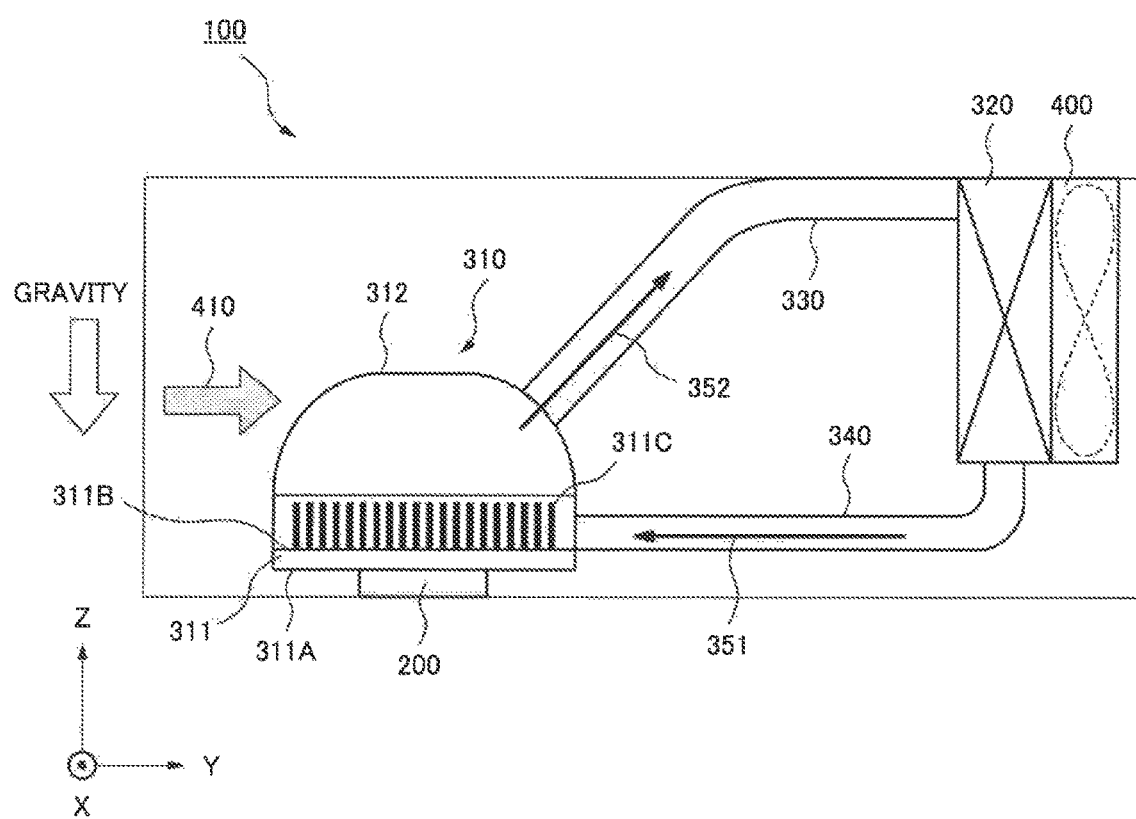
FIG. 1B is a conceptual diagram of an electronic device mounting the phase change cooling system of FIG. 1A.
Figure 2A:
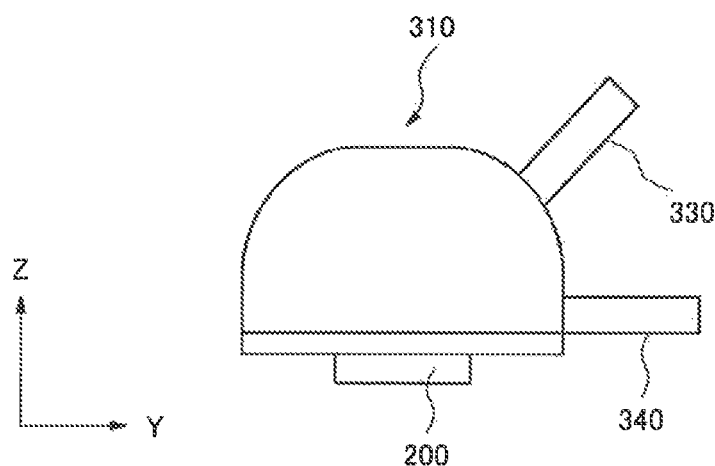
FIG. 2A is a side view of a portion in the vicinity of a heat receiving unit of the phase change cooling system of FIG. 1B.
Figure 2B:
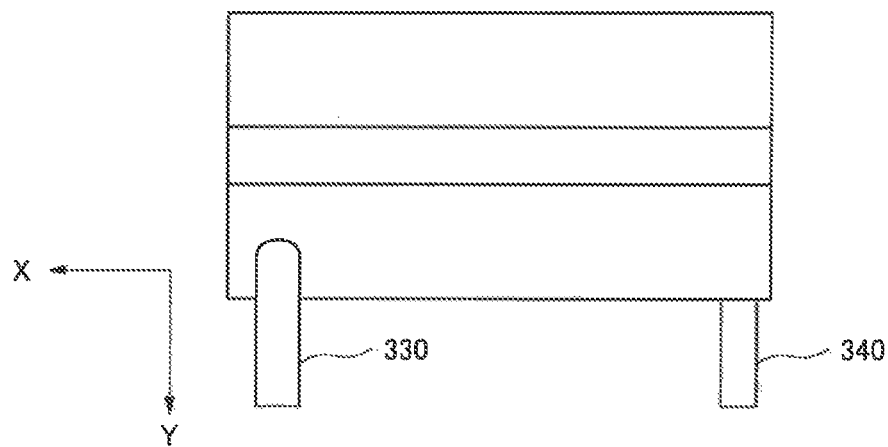
FIG. 2B is a top view of the portion in the vicinity of the phase change cooling system of FIG. 1B.
Figure 2C:
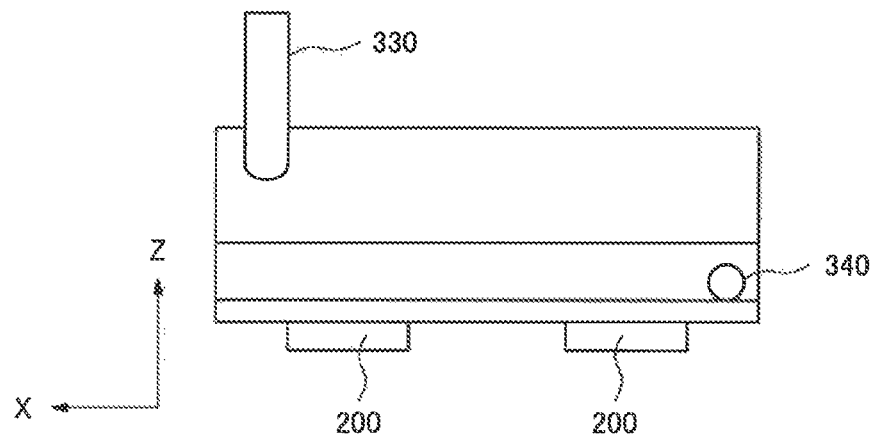
FIG. 2C is another side view of the portion in the vicinity of the phase change cooling system of FIG. 1B.

Next, a phase change cooling system and an electronic device according to a first example embodiment of the present invention will be described. FIG. 1A is a conceptual diagram of the phase change cooling system according to the first example embodiment of the present invention, and FIG. 1B is a conceptual diagram of the electronic device mounting the phase change cooling system of FIG. 1A. In other words, FIG. 1B is a conceptual diagram of a Y-Z cross section of the electronic device mounting the phase change cooling system according to the present example embodiment. FIG. 2A is a side view of a portion in the vicinity of the heat receiving unit of the phase change cooling system of FIG. 1B; FIG. 2B is a top view of the portion in the vicinity of the heat receiving unit of the phase change cooling system of FIG. 1B; and FIG. 2C is another side view of the portion in the vicinity of the heat receiving unit of the phase change cooling system of FIG. 1B. In other words, FIGS. 2A to 2C are trihedral figures of the portion in the vicinity of the heat receiving unit of the phase change cooling system according to the present example embodiment.

(Description of Configuration)

As illustrated in FIG. 1A, a phase change cooling system 300 according to the present example embodiment includes a heat receiving unit 310, a heat dissipating unit 310, a vapor pipe 330 and a liquid pipe 340, namely, a vapor pipe and a liquid pipe that interconnect the heat receiving unit 310 and the heat dissipating unit 320 to form a loop, and coolant 350, namely, coolant encapsulated inside the phase change cooling system 300. Further, it is a feature that the heating receiving unit 310 of the phase change cooling system 300 of FIG. 1A has an approximately semicircular cross section, and the vapor pipe 330 is coupled to an inclined face of the heat receiving unit 310.

As illustrated in FIG. 1B, an electronic device 100, namely, the electronic device according to the present example embodiment, includes the phase change cooling system 300 of FIG. 1A. The electronic device 100 further includes heat generating objects 200, which are mounted therein, and a cooling fan 400.

The phase change cooling system 300 according to the present example embodiment will be described in more detail. The heating receiving unit 310 of the phase change cooling system 300 is constituted by a base 311 and a jacket 312, and its Y-Z cross section has an approximately semicircular shape. In addition, the heat receiving unit 310 includes a hollow portion, and the coolant liquid 351 is pooled inside thereof.

The vapor pipe 330 and the liquid pipe 340 are respectively coupled to the inclined face, which is provided on the jacket 312 of the heat receiving unit 310, and a side face of the jacket 312. Further, the opposite end of the vapor pipe 330 and the opposite end of the liquid pipe 340 are respectively coupled to an upper portion of the heat dissipating unit 320 and a lower portion of the heat dissipating unit 320, thereby allowing a coolant flow path to be formed in the form of a loop. Here, the heat dissipating unit 320 is disposed at a position far from the heat receiving unit 310 in the Y-axis direction, and thus, the vapor pipe 330 is caused to bend at an angle of approximately 45 degrees within the Y-Z plane.

The heat generating object 200 of the phase change cooling system 300 is secured to a heat receiving face 311A, namely, an outer face of the base 311 of the heat receiving unit 310. Further, an assembly 311C, namely, an assembly including fins or the like, is provided on a heat transfer face 311B, namely, an inner face of the base 311 of the heat receiving unit 310. With this configuration, the area of the contact with the coolant liquid 351 is increased, and thereby, the cooling performance of the heat receiving unit 310 is enhanced.

The base 311 of the heat receiving unit 310 and the jacket 312 of the heat receiving unit 310 are assumed to be manufactured by means of extruding, pressing, or the like, and thereby, manufacturing cost is reduced to low cost. Further, for these portions, metal having high thermal conductivity, such as aluminum, copper, or the like, is used as their row materials, and jointing by means of brazing or the like is assumed at the time when the integration with the heat receiving unit 310 is made, but in the case where different kinds of metals for which the jointing is difficult are used, a means of screw cramping in a state in which a sealing material is sandwiched between the metals, or the like, may be employed.

Figure 3A:
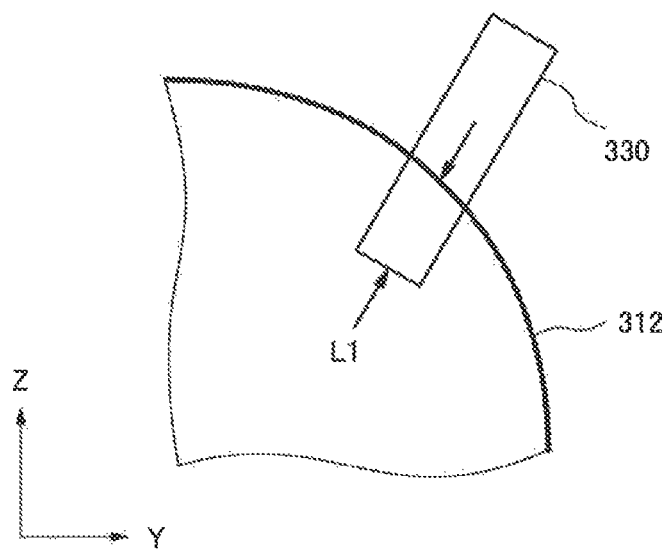
FIG. 3A is an enlarged schematic diagram of a portion in the vicinity of a coupling portion in the case where a pipe is obliquely coupled to a face.
Figure 3B:
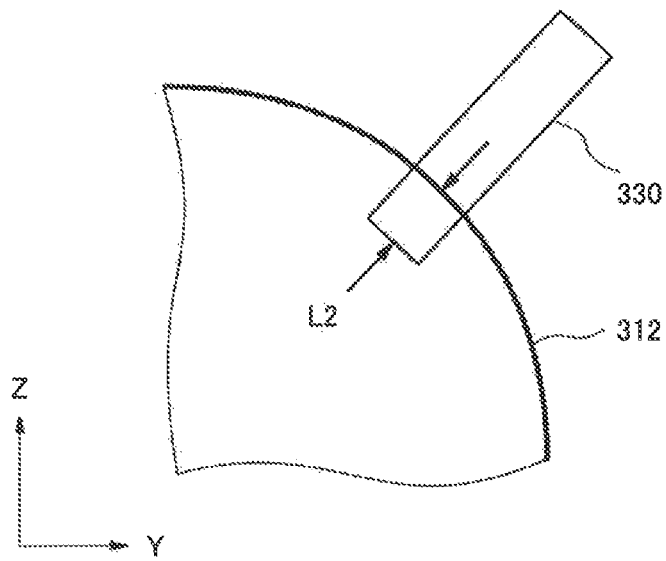
FIG. 3B is an enlarged schematic diagram of a portion in the vicinity of a coupling portion in the case where the pipe is perpendicularly coupled to the face.

The vapor pipe 330 is assumed to be coupled in such a way as to be approximately perpendicular to the coupling portion between the heat receiving unit 310 and the heat dissipating unit 320. FIG. 3A is an enlarged schematic view of a portion in the vicinity of a coupling portion in the case where a pipe is obliquely coupled to a face, and FIG. 3B is an enlarged schematic view of a portion in the vicinity of a coupling portion in the case where the pipe is perpendicularly coupled to the face. A pipe insertion length (L1) in the case where the pipe is obliquely coupled to the face is relatively longer than a pipe insertion length (L2) in the case where the pipe is perpendicularly coupled to the face.

In the case where the pipe is obliquely coupled to the face, the pipe insertion length becomes longer, and thus, the pressure loss of an inlet portion from the heat receiving unit 310 to the vapor pipe 330 is increased. Further, this increase of the pressure loss leads to the degradation of the cooling performance. Further, in the case where the pipe is obliquely coupled to the face, a process of making a hole in the face, a process of fixing the pipe at a designated angle, and the like, become processes of a higher difficulty level, and thus, the manufacturing cost is increased.

Figure 4:
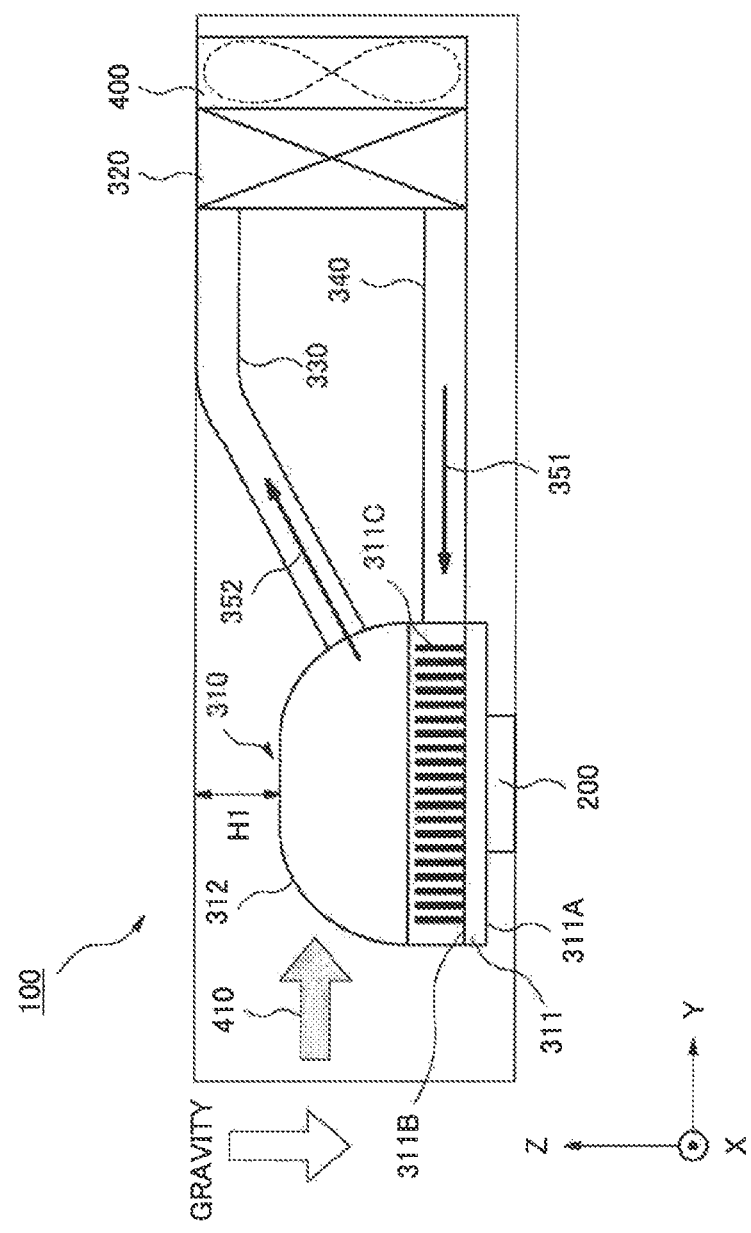
FIG. 4 is a conceptual diagram of an electric device mounting a phase change cooling system in the case where a bending angle of a vapor pipe is small, according to the first example embodiment.

An optimal value of the blending angle of the vapor pipe 330 varies in accordance with relative positions for the heat receiving unit 310 and the heat dissipating unit 320, and an angle of 45±15 degrees is assumed in the present example embodiment. In the case where the bending angle is larger than this angle, this structure comes close to the structures of Background Art, and thus, advantage effects of the present example embodiment cannot be sufficiently obtained. In contrast, in the case where the bending angle is smaller than the above angle (FIG. 4), a top-face height difference (H1) for the heat receiving unit 310 and the heat dissipating unit 320 becomes smaller; ventilation resistance of cooling wind 410 is increased because the heat receiving unit 310 becomes an obstacle; and the air volume supplied to the heat dissipating unit 320 is decreased, thereby causing the cooling performance to be degraded. Additionally, when the above configuration in which the pipe is perpendicularly coupled to the face is taken into consideration, as a result, the size of the phase change cooling system 300 in the Y-axis direction becomes larger.

In FIG. 1B, the cooling fan 400 is disposed immediately near the heat dissipating unit 320 on the downwind side, but the disposition position and the wind direction are not limited to this configuration. Further, in FIG. 2C, two heat generating objects 200 are illustrated, but its total number is not limited to this illustration, and further, the disposition positions of the heat generating objects 200 are not limited to the illustration.

(Description of Operation)

The operation of the phase change cooling system 300 according to the present example embodiment and the cooling of the heat generating object 200 will be described. When the electronic device 100 is allowed to operate, the heat generating object 200 mounted in the electric device 100 generates heat. The heat having been generated in the heat generating object 200 is transferred to the heat receiving face 311A; is dissipated to the heat transfer face 311B and the assembly 311C including fins or the like; and is transferred to the coolant liquid 351. At this time, the coolant liquid 351 evaporates, and the heat is maintained in the form of latent heat. Coolant vapor 352 moves upward because of a vapor-liquid density difference, and moves to the heat dissipating unit 320 through the vapor pipe 330. The coolant vapor 352 exchanges heat with cooling wind 410 supplied from the cooling fan 400, and condenses into the coolant liquid 351 by dissipating the latent heat. The coolant liquid 351 moves downward because of the vapor-liquid density difference, and returns to the heat receiving unit 310 again through the liquid pipe 340. In this way, the cooling is performed in a way that allows the heat having been generated in the heat generating object 200 to be heat-dissipated through the repetitions of a natural circulation using a vapor-liquid phase change of coolant.

(Description of Advantageous Effects)

In the phase change cooling system 300 of the present example embodiment, the heat receiving unit 310 has an approximately semicircular cross section, and the vapor pipe 330 is coupled to the inclined face of the heat receiving unit 310. More specifically, in the present example embodiment, the vapor pipe 330 is coupled to the inclined face of the jacket 312 of the heat receiving unit 310, and thereby its bending angle is reduced up to an angle of approximately 45 degrees. With this configuration, the pressure loss at the time when the coolant vapor 352 passes through the vapor pipe 330 can be reduced, as compared with that of Background Art. Further, as a result of the reduction of the bending angle, since, even in the case of the same cooling system size, the radius of the vapor pipe 330 can be made thick in a state in which the curvature of the vapor pipe 300 is maintained, the flow speed of the coolant becomes slower, and the pressure loss can be further reduced.

As a result of the formation of the cross section of the heat receiving unit 310 into the approximately semicircular shape, the flow path of the vapor is gently reduced from the heat receiving unit 310 toward the vapor pipe 330, and thus, the pressure loss at the time when the coolant vapor 352 is flown into the vapor pipe 330 can be also reduced. Further, in this portion as well, by making the radius of the vapor pipe 330 thick, the reduction rate becomes gentle and the flow speed of the coolant becomes slow, and thus, the pressure loss can be further reduced.

With these configurations, since the pressure loss of the entire cooling system can be made small, and the boiling point elevation of the coolant liquid 351 can be reduced, the cooling performance can be enhanced.

In the present example embodiment, the inclined face is provided on the jacket 312 of the heat receiving unit 310. As a result of this configuration, a face perpendicularly opposite to the wind direction of the cooling wind 410 having been generated by the cooling fan 400 is reduced, and ventilation resistance is decreased. In this way, since, even in the case of the same cooling-fan electric power, the air volume is increased, the thermal resistance of the heat dissipating unit 320 is decreased and the boiling point of the coolant liquid 351 is lowered, thus enabling the cooling performance to be enhanced.

Further, according to the present example embodiment, the pressure resistance performance in the case where the heat dissipation amount of the cooling system is increased can be enhanced. In the phase change cooling system, a portion having the highest inner pressure is the heat receiving unit, and the inner pressure of the heat receiving unit has a proportionality relation with the boiling point of the coolant liquid. Here, as is understandable from the formula (1) having been described in Background Art, the dissipation amount is directly related to the boiling point of the coolant liquid, and the pressure inside the heat receiving unit increases as the dissipation amount increases. Apart from this relation, as is understandable from the formula (1)' and the formula (2), the dissipation amount is also indirectly related to the boiling point of the coolant liquid. In a structure having a large local pressure loss coefficient, like those in PTL1, PTL2, and PTL3, when the dissipation amount increases, the boiling point elevation occurs, and the pressure inside the heat receiving unit further increases.

Particularly, like in PTL1, in the case where the cross section of the heat receiving unit has an approximately rectangular shape, the top face is a relatively broad, flat face, and thus, the heat receiving unit is not endurable against high pressure. As a result, the heating receiving unit expands because of the occurrence of plastic deformation, and thereby, the heat receiving unit leads to destruction in the worst case. Further, even in the case where the heat receiving unit does not immediately lead to destruction, there is also a possibility that the phase change cooling system may lead to fatigue destruction during the repetitions of the expansion/contraction of the heat receiving unit in conjunction with on/off of the electronic device.

In the present example embodiment, as described above, the boiling point elevation of the coolant liquid 351 can be reduced by coupling the vapor pipe 330 to the inclined face of the heat receiving unit 310, and thus, the indirect increase of the pressure inside the heat receiving unit can be reduced. Moreover, the jacket 312 of the heat receiving unit 310 is formed into a curved face by forming the cross section of the heat receiving unit 310 into the approximately semicircular shape, thereby causing the pressure applied to the plate material of the jacket 312 of the heat receiving unit 310 to be dispersed. Since the equivalent stress can be reduced to equal to or less than the half even in the case where the plate thickness remains the same, the deformation amount can be made small, and thereby the possibility that the heat receiving unit 310 leads to destruction can be lowered. With these configurations, the pressure resistance performance can be enhanced.

As described above, according to the present example embodiment, in a state in which the size and the weight of the phase change cooling system 300 and the electric power for the cooling fan 400 are maintained, the cooling performance and the pressure resistance performance can be enhanced. With this configuration, the use of the phase change cooling system also becomes possible in the case where a plurality of heat generating objects that has a significantly large amount of heat generation and that is mounted with a high density is cooled by one cooling system.

Second Example Embodiment

Next, a phase change cooling system and an electronic device according to a second example embodiment will be described. The phase change cooling system of the present example embodiment is a modification example of the phase change cooling system of the first example embodiment. The same elements as the elements of the first example embodiment will be denoted by the same reference numbers as those of the elements of the first example embodiment, and thereby will be omitted from detailed description.

Figure 5A:
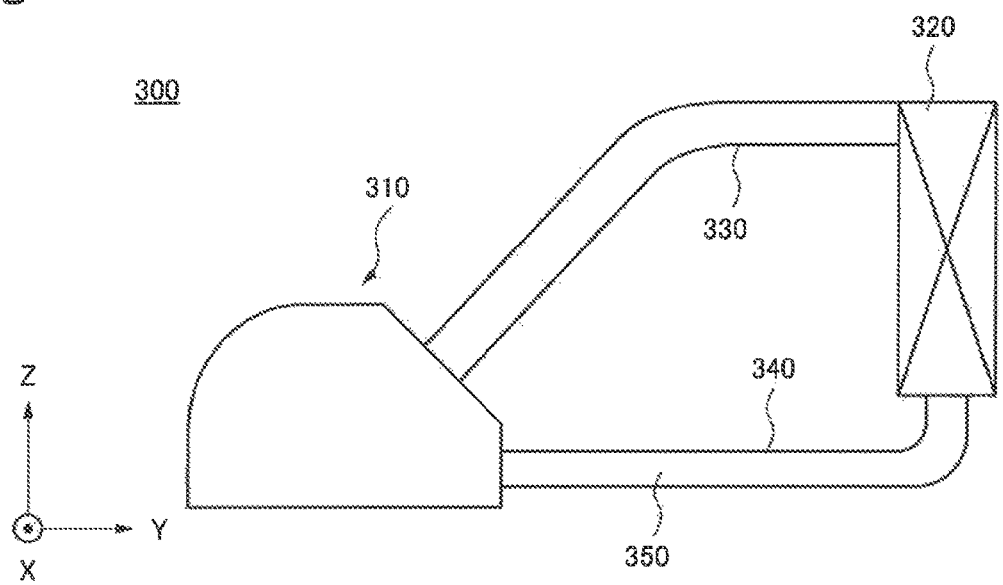
FIG. 5A is a conceptual diagram of a phase change cooling system according to a second example embodiment of the present invention.
Figure 5B:
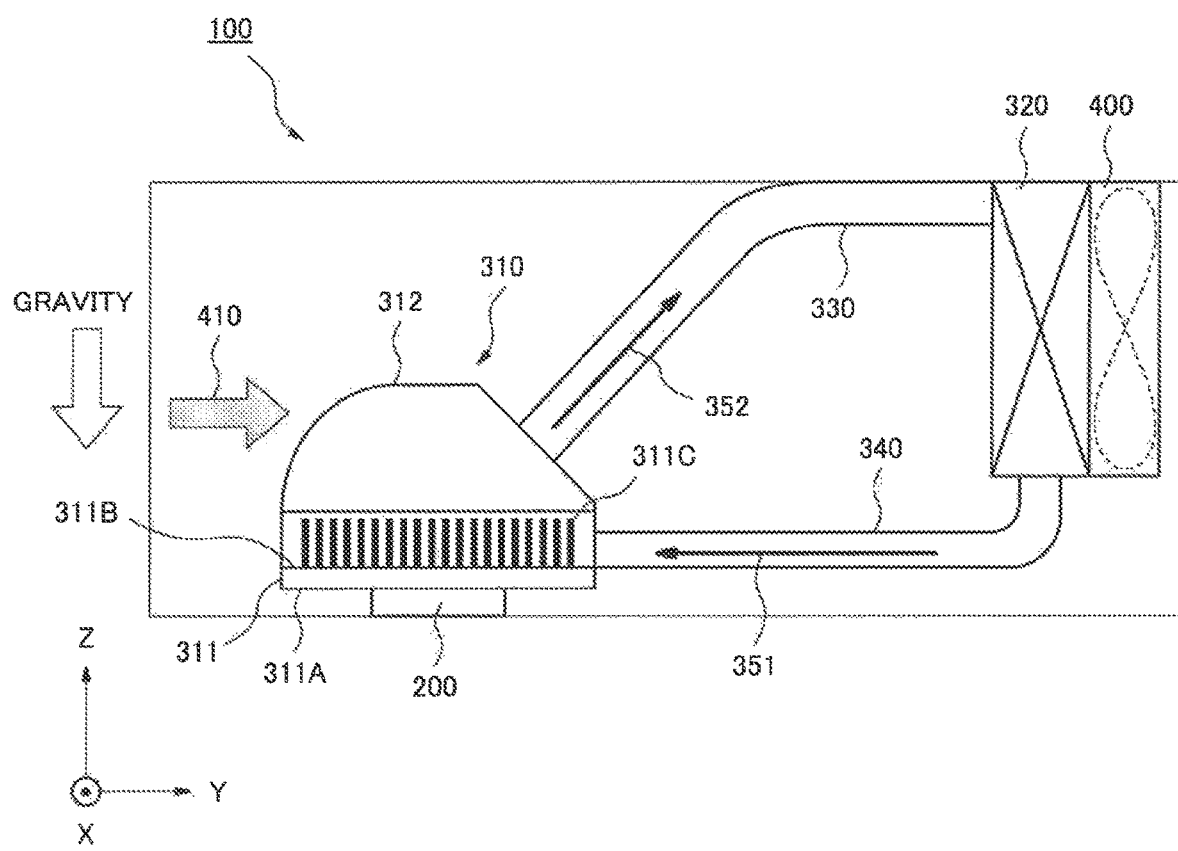
FIG. 5B is a conceptual diagram mounting the phase change cooling system of FIG. 5A.
Figure 6A:
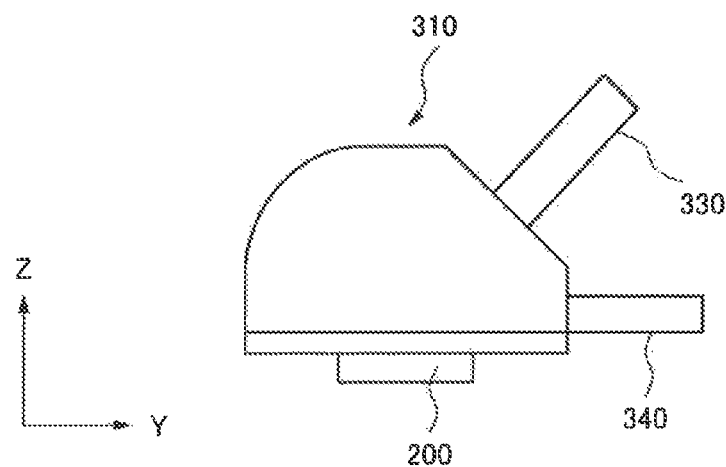
FIG. 6A is a side view of a portion in the vicinity of a heat receiving unit of the phase change cooling system of FIG. 5B.
Figure 6B:
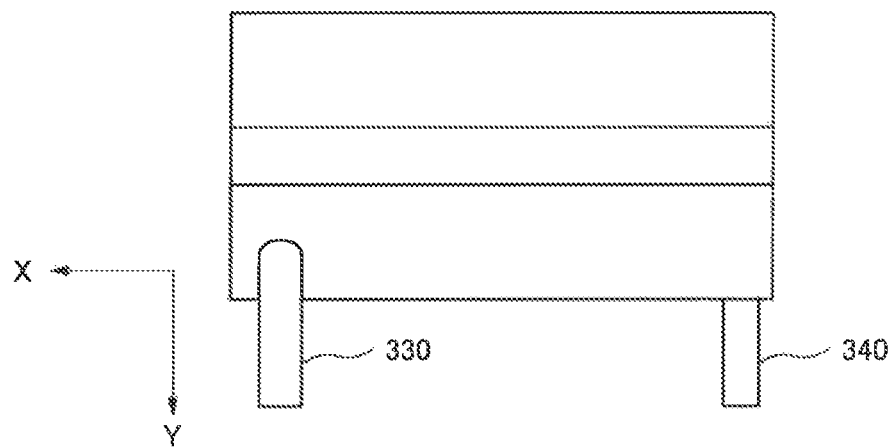
FIG. 6B is a top view of the portion in the vicinity of the phase change cooling system of FIG. 5B.
Figure 6C:
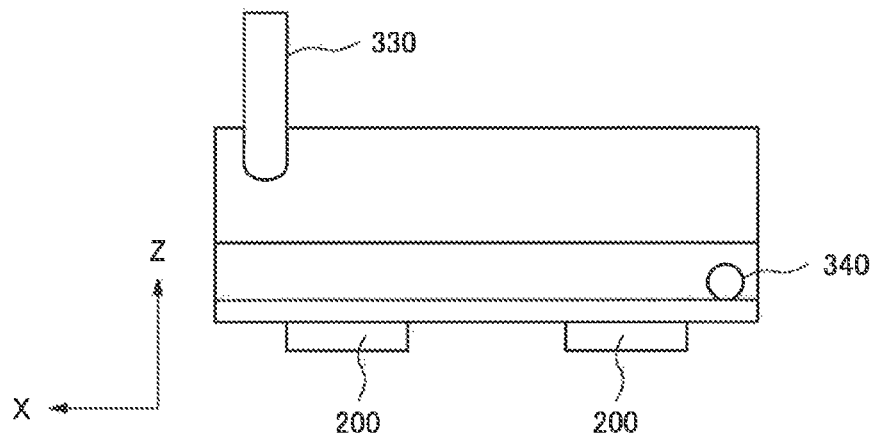
FIG. 6C is another side view of the portion in the vicinity of the phase change cooling system of FIG. 5B.

FIG. 5A is a conceptual diagram of the phase change cooling system according to the second example embodiment of the present invention, and FIG. 5B is a conceptual diagram of the electronic device mounting the phase change cooling system of FIG. 5A. In other words, FIG. 5B is a conceptual diagram of a Y-Z cross section of the electronic device mounting the phase change cooling system according to the present example embodiment. FIG. 6A is a side view of a portion in the vicinity of the heat receiving unit of the phase change cooling system of FIG. 5B; FIG. 6B is a top view of the portion in the vicinity of the heat receiving unit of the phase change cooling system of FIG. 5B; and FIG. 6C is another side view of the portion in the vicinity of the heat receiving unit of the phase change cooling system of FIG.

5B. In other words, FIGS. 6A to 6C are trihedral figures of the portion in the vicinity of the heat receiving unit of the phase change cooling system according to the present example embodiment.

(Description of Configuration)

The structure according to the present example embodiment is a structure resulting from a change from the first example embodiment, which is made such that a portion in the vicinity of the coupling portion of the vapor pipe 330 within the inclined face of the jacket 312 of the heat receiving unit 310 is changed into a flat face from the curved face.

As illustrated in FIG. 5A, the phase change cooling system 300 according to the present example embodiment includes the heat receiving unit 310, the heat dissipating unit 310, the vapor pipe 330 and the liquid pipe 340 that interconnect the heat receiving unit 310 and the heat dissipating unit 320 to form a loop, and the coolant 350 encapsulated inside the phase change cooling system 300. Further, it is a feature that the heating receiving unit 310 of the phase change cooling system 300 of FIG. 5A has an approximately semicircular cross section, and the vapor pipe 330 is coupled to an inclined face of the heat receiving unit 310. Further, in the present example embodiment, it is a feature that, within the inclined face of the heat receiving unit 310, the portion in the vicinity of the coupling portion coupled to the vapor pipe 330 is formed into such a flat face.

As illustrated in FIG. 5B, the electronic device 100 according to the present example embodiment, includes the phase change cooling system 300 of FIG. 5A. The electronic device 100 further includes the heat generating objects 200, which are mounted therein, and the cooling fan 400.

Note that, in FIGS. 5A and 5B, the whole of the coupling face coupled to the vapor pipe 330 is formed into a flat face, along the X-axis direction, but it is not necessary to form the whole of the coupling face into the flat face, and it is enough just to form the portion in the vicinity of the coupling portion into the flat face. On the contrary, the Y-Z cross section of the heat receiving unit 310 may be changed from the approximately semicircular shape to an approximately polygonal shape.

The vapor pipe 330 is assumed to be coupled in such a way as to be approximately perpendicular to the coupling portion between the heat receiving unit 310 and the heat dissipating unit 320. A pipe insertion length in the case where the pipe is obliquely coupled to the face is relatively longer than a pipe insertion length in the case where the pipe is perpendicularly coupled to the face.

In the case where the pipe is obliquely coupled to the face, the pressure loss of an inlet portion from the heat receiving unit 310 to the vapor pipe 330 is increased, and this increase of the pressure loss leads to the degradation of the cooling performance. Further, in the case where the pipe is obliquely coupled to the face, a process of making a hole in the face, a process of fixing the pipe at a designated angle, and the like, become processes of a higher difficulty level, and thus, manufacturing cost is increased.

An optimal value of the blending angle of the vapor pipe 330 varies in accordance with relative positions of the heat receiving unit 310 and the heat dissipating unit 320, and an angle of 45±15 degrees is assumed in the present example embodiment. In the case where the bending angle is larger than this angle, this structure comes close to the structures of Background Art, and thus, the advantageous effects of the present example embodiment may be unable to be sufficiently obtained.

In FIG. 5B, the cooling fan 400 is disposed immediately near the heat dissipating unit 320 on the downwind side, but the disposition position and the wind direction are not limited to this configuration. Further, in FIG. 6C, two heat generating objects 200 are illustrated, but its total number is not limited to this illustration, and further, the disposition positions of the heat generating objects 200 are not limited to the illustration.

(Description of Operation)

The operation of the phase change cooling system 300 according to the present example embodiment and the cooling of the heat generating object 200 will be described. When the electronic device 100 is allowed to operate, the heat generating object 200 mounted in the electric device 100 generates heat. The heat having been generated in the heat generating object 200 is transferred to the heat receiving face 311A; is dissipated to the heat transfer face 311B and the assembly 311C including the fins or the like; and is transferred to the coolant liquid 351. At this time, the coolant liquid 351 evaporates, and the heat is maintained in the form of latent heat. The coolant vapor 352 moves upward because of a vapor-liquid density difference, and moves to the heat dissipating unit 320 through the vapor pipe 330. In the heat dissipating unit 320, the coolant vapor 352 exchanges heat with the cooling wind 410 supplied from the cooling fan 400, and condenses into the coolant liquid 351 by dissipating the latent heat. The coolant liquid 351 moves downward because of the vapor-liquid density difference, and returns to the heat receiving unit 310 again through the liquid pipe 340. In this way, the cooling is performed in a way that allows the heat having been generated in the heat generating object 200 to be heat-dissipated through the repetitions of a natural circulation using the vapor-liquid phase change of coolant.

Description of Advantageous Effects

In the phase change cooling system 300 of the present example embodiment, like the first example embodiment, the heat receiving unit 310 has an approximately semicircular cross section, and the vapor pipe 330 is coupled to the inclined face of the heat receiving unit 310. More specifically, in the present example embodiment, the vapor pipe 330 is coupled to the inclined face of the jacket 312 of the heat receiving unit 310, and thereby its bending angle is reduced up to an angle of approximately 45 degrees. With this configuration, the pressure loss at the time when the coolant vapor 352 passes through the vapor pipe 330 can be reduced, as compared with that of Background Art.

Figure 7A:
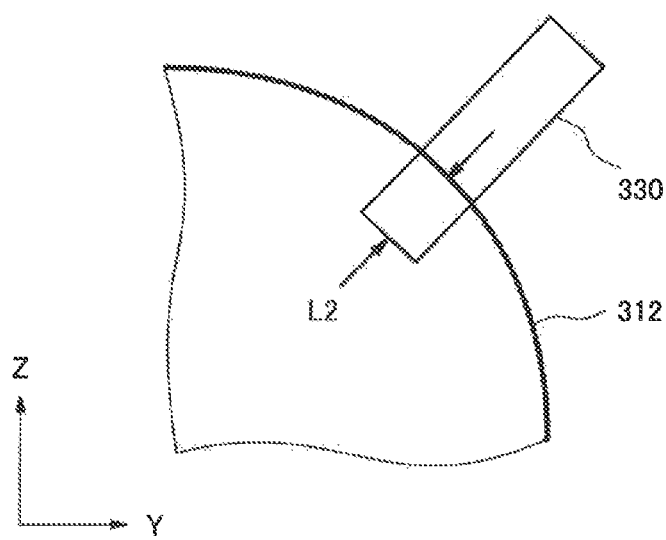
FIG. 7A is an enlarged schematic diagram of a portion in the vicinity of a coupling portion in the case where a pipe is coupled to a curved face.
Figure 7B:
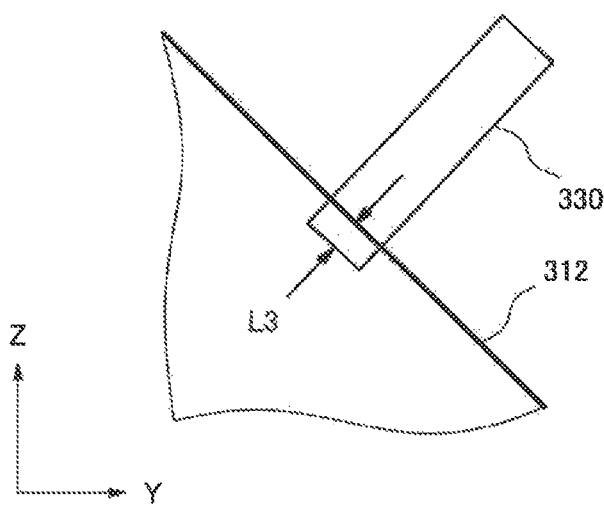
FIG. 7B is an enlarged schematic diagram of a portion in the vicinity of a coupling portion in the case where the pipe is coupled to a flat face.

Moreover, in the present example embodiment, within the inclined face of the heat receiving unit 310, the portion in the vicinity of the coupling portion coupled to the vapor pipe 330 is formed into the flat face. FIG. 7A is an enlarged schematic view of a portion in the vicinity of a coupling portion in the case where a pipe is coupled to a curved face, and FIG. 7B is an enlarged schematic view of a portion in the vicinity of a coupling portion in the case where the pipe is coupled to a flat face. A pipe insertion length (L3) in the case where the pipe is coupled to the flat face is relatively shorter than a pipe insertion length (L2) in the case where the pipe is coupled to the curved face. According to the present example embodiment, the pipe insertion length of the vapor pipe 330 is short, as compared with the phase change cooling system of the first example embodiment, and thus, the pressure loss of an inlet portion from the heat receiving unit 310 to the vapor pipe 330 is reduced, thereby enabling the cooling performance to be further enhanced.

Third Example Embodiment

Next, a phase change cooling system and an electronic device according to a third example embodiment will be described. The phase change cooling system of the present example embodiment is a modification example of the phase change cooling system of the first example embodiment. The same elements as the elements of the first example embodiment will be denoted by the same reference numbers as those of the elements of the first example embodiment, and thereby will be omitted from detailed description.

Figure 8A:
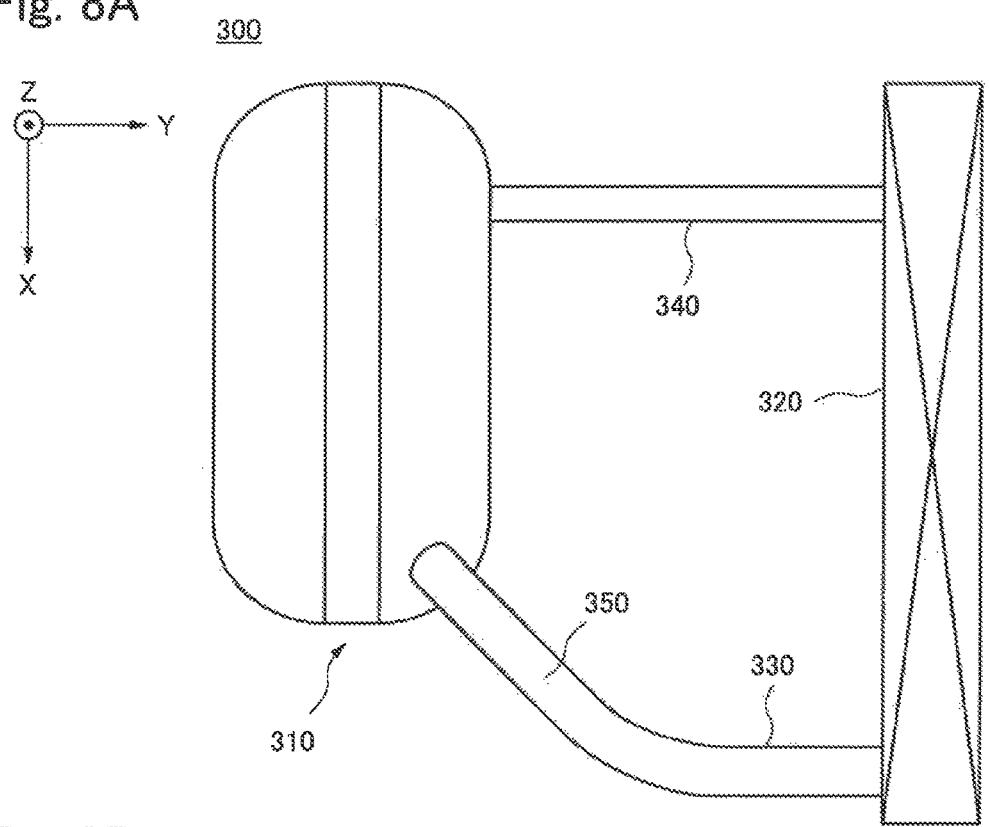
FIG. 8A is a conceptual diagram of a phase change cooling system according to a third example embodiment of the present invention.
Figure 8B:
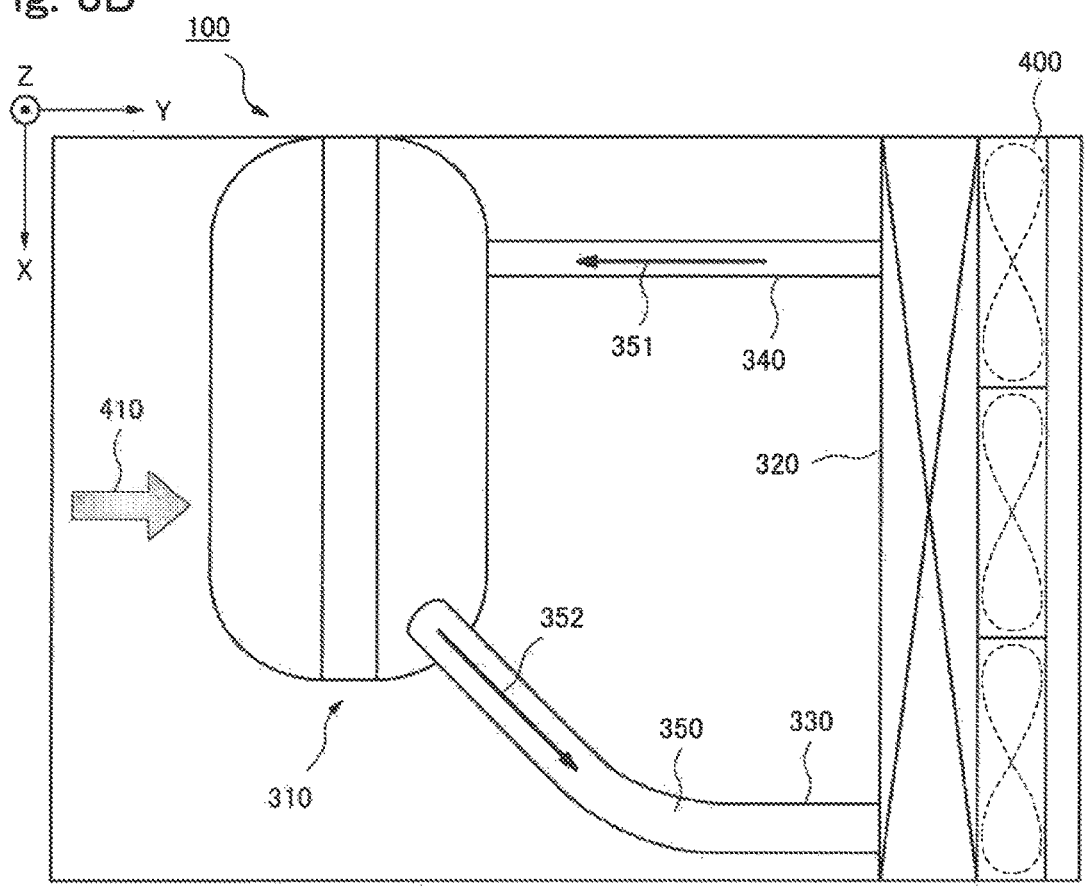
FIG. 8B is a conceptual diagram of an electronic device mounting the phase change cooling system of FIG. 8A.
Figure 9A:
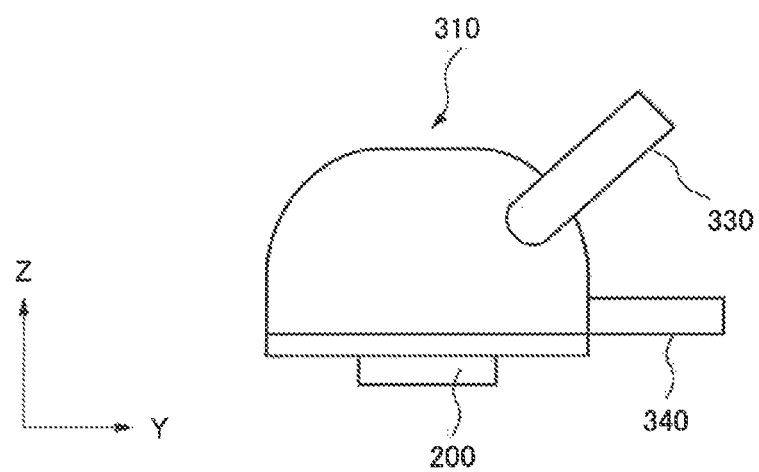
FIG. 9A is a side view of a portion in the vicinity of a heat receiving unit of the phase change cooling system of FIG. 8B.
Figure 9B:
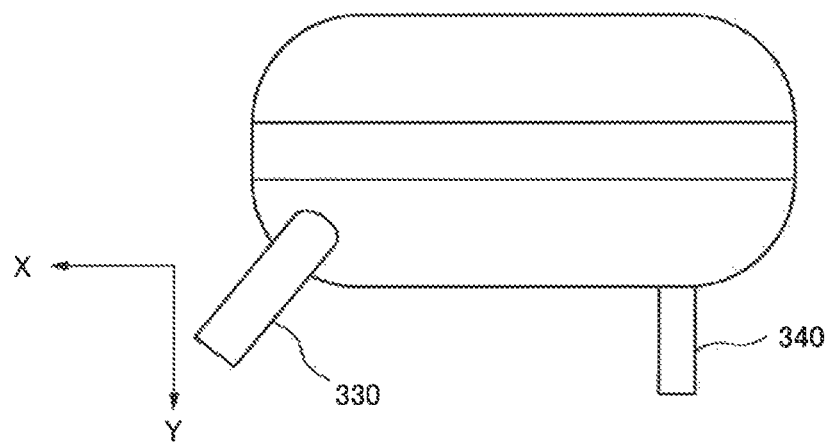
FIG. 9B is a top view of the portion in the vicinity of the phase change cooling system of FIG. 1B.
Figure 9C:
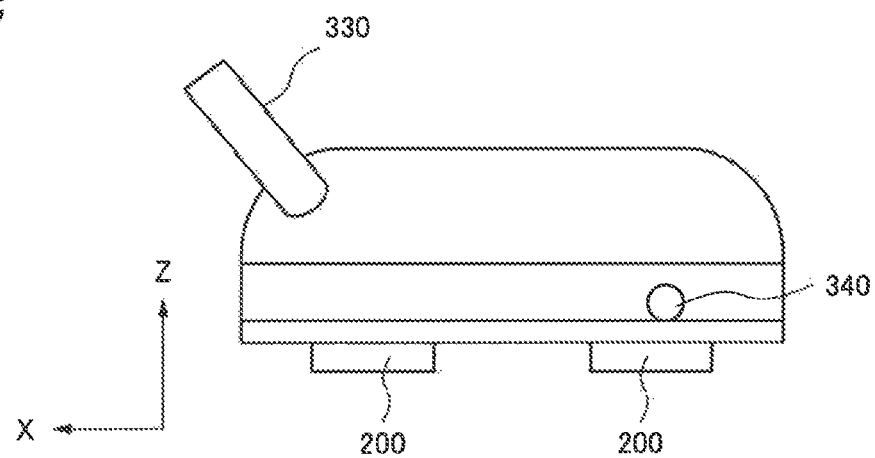
FIG. 9C is another side view of the portion in the vicinity of the phase change cooling system of FIG. 8B.
Figure 10:
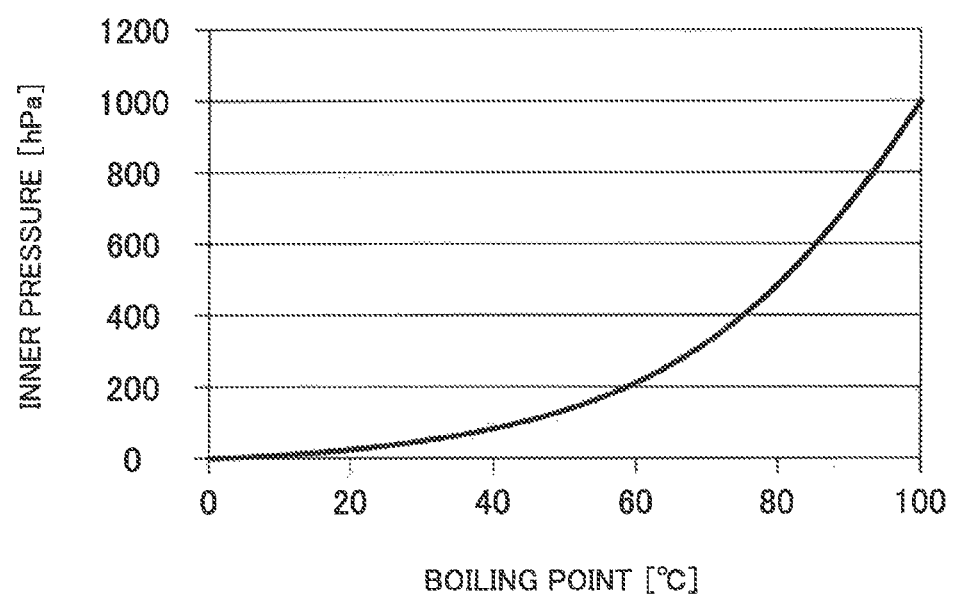
FIG. 10 is a graph illustrating a vapor pressure curved line of water as an example of coolant.
Figure 11:
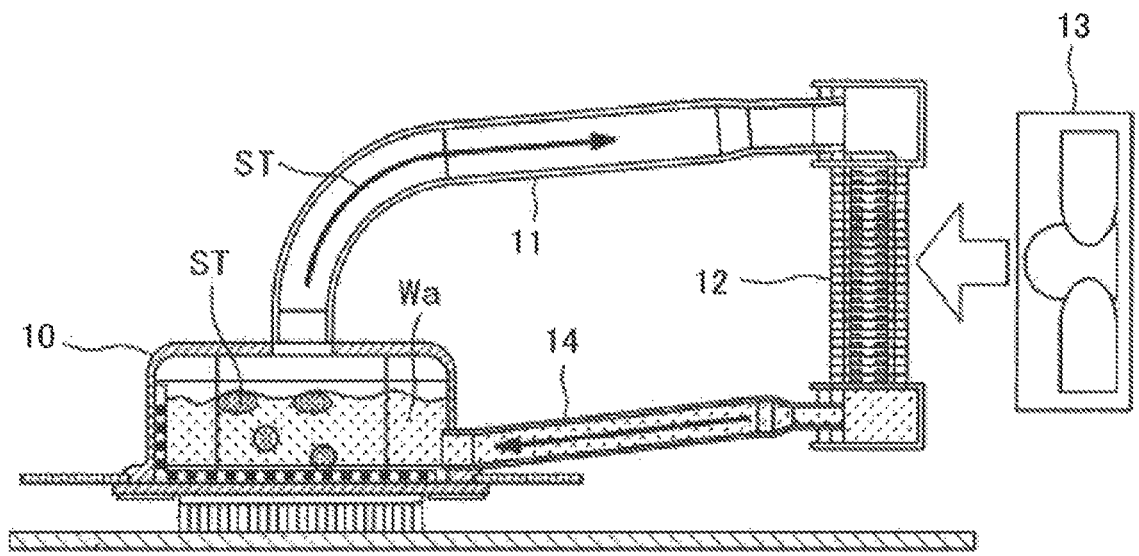
FIG. 11 is a cross-sectional view of a cooling system of PTL1.

FIG. 8A is a conceptual diagram of the phase change cooling system according to the third example embodiment of the present invention, and FIG. 8B is a conceptual diagram of the electronic device mounting the phase change cooling system of FIG. 8A. In other words, FIG. 8B is a conceptual diagram of a Y-Z cross section of the electronic device mounting the phase change cooling system according to the present example embodiment. FIG. 9A is a side view of a portion in the vicinity of the heat receiving unit of the phase change cooling system of FIG. 8B; FIG. 9B is a top view of the portion in the vicinity of the heat receiving unit of the phase change cooling system of FIG. 8B; and FIG. 9C is another side view of the portion in the vicinity of the heat receiving unit of the phase change cooling system of FIG. 8B. In other words, FIGS. 9A to 9C are trihedral figures of the portion in the vicinity of the heat receiving unit of the phase change cooling system according to the present example embodiment. The phase change cooling system of the present example embodiment is a modification example of the phase change cooling system of the first example embodiment.

(Description of Configuration)

The structure according to the present example embodiment is a structure resulting from a change from the structure of the first example embodiment, which is made such that an X-Y cross section of the heat receiving unit 310 is also changed into an approximately (semi)circular shape or an approximately polygonal shape. Further, the vapor pipe 330 is coupled to an inclined face within a Y-Z plane and an X-Y plane.

As illustrated in FIG. 8A, the phase change cooling system 300 according to the present example embodiment includes the heat receiving unit 310, the heat dissipating unit 310, the vapor pipe 330 and the liquid pipe 340 that interconnect the heat receiving unit 310 and the heat dissipating unit 320 to form a loop, and the coolant 350 encapsulated inside the phase change cooling system 300. Further, the heat receiving unit 310 of the phase change cooling system 300 of FIG. 8A is constituted by a base and a jacket, and its Y-Z cross section and its X-Y cross section are respectively formed into an approximately semicircular shape and an approximately circular shape. In addition, the heat receiving unit 310 includes a hollow portion, and the coolant liquid 351 is pooled inside thereof.

As illustrated in FIG. 8B, the electronic device 100 according to the present example embodiment includes the phase change cooling system 300 of FIG. 8A. The electronic device 100 further includes the heat generating objects, which are mounted therein, and the cooling fan 400.

The vapor pipe 330 is coupled to the inclined face located within the Y-Z plane and the X-Y plane and provided on the jacket 312 of the heat receiving unit 310, and the liquid pipe 340 is provided on a side face of the jacket 312. Further, the opposite end of the vapor pipe 330 and the opposite end of the liquid pipe 340 are respectively coupled to an upper portion of the heat dissipating unit 320 and a lower portion of the heat dissipating unit 320, thereby allowing a coolant flow path to be formed in the form of a loop. Here, the heat dissipating unit 320 is disposed at a position far from the heat receiving unit 310 in the Y-axis direction, and thus, the vapor pipe 330 is caused to bend at an angle of approximately 45 degrees within the Y-Z plane. Moreover, in the phase change cooling system 300 of the present example embodiment, the X-axis direction size of the heat receiving unit 310 and that of the heat dissipating unit 321 are different from each other, and thus, the vapor pipe 330 is also caused to bend at an angle of approximately 45 degrees within the X-Y plane. Here, it is a feature that the vapor pipe 330 is caused to bend at one point, not at two points.

In FIG. 8B, three cooling fans 400 are disposed immediately near the heat dissipating unit on the downwind side, but the disposition position and the wind direction are not limited to this configuration. Further, in FIG. 9C, two heat generating objects 200 are illustrated, but its total number is not limited to this illustration, and further, the disposition positions of the heat generating objects 200 are not limited to the illustration.

(Description of Operation)

The operation of the phase change cooling system 300 according to the present example embodiment and the cooling of the heat generating object 200 will be described. When the electronic device 100 is allowed to operate, the heat generating object 200 mounted in the electric device 100 generates heat. The heat having been generated in the heat generating object 200 is transferred to the heat receiving face 311A; is dissipated to the heat transfer face 311B and the assembly 311C including the fins or the like; and is transferred to the coolant liquid 351. At this time, the coolant liquid 351 evaporates, and the heat is maintained in the form of latent heat. The coolant vapor 352 moves upward because of a vapor-liquid density difference, and moves to the heat dissipating unit 320 through the vapor pipe 330. In the heat dissipating unit 320, the coolant vapor 352 exchanges heat with the cooling wind 410 supplied from the cooling fan 400, and condenses into the coolant liquid 351 by dissipating the latent heat. The coolant liquid 351 moves downward because of the vapor-liquid density difference, and returns to the heat receiving unit 310 again through the liquid pipe 340. In this way, the cooling is performed in a way that allows the heat having been generated in the heat generating object 200 to be heat-dissipated through the repetitions of a natural circulation using the vapor-liquid phase change of coolant.

Description of Advantageous Effects

In the phase change cooling system 300 of the present example embodiment, like the first example embodiment, the heat receiving unit 310 has an approximately semicircular Y-Z cross section, and the vapor pipe 330 is coupled to the inclined face of the heat receiving unit 310. More specifically, in the present example embodiment, the vapor pipe 330 is coupled to the inclined face of the jacket 312 of the heat receiving unit 310, and thereby its bending angle is reduced up to an angle of approximately 45 degrees. With this configuration, the pressure loss at the time when the coolant vapor 352 passes through the vapor pipe 330 can be reduced, as compared with that of Background Art.

There occurs a situation in which the X-axis direction sizes of the heat receiving unit 310 and the heat dissipating unit 320 are different from each other, and the size of the heat dissipating unit 320 is larger. This is because the heat receiving unit 310 is disposed in a narrow space in the vicinity of the heat generating object 200, whereas the heat dissipating unit 320 is disposed in a relatively broad space inside the electronic device 100 to ensure a heat dissipating area.

In such a case, it is common that such a situation is dealt with by causing the side face on the side of the vapor pipe 330 to align and causing the liquid pipe 340 to bend within the X-Y plane. This is because, since, in the inside of the liquid pipe 340, the coolant vapor 352 is not flown, but the coolant liquid 351 having a higher density is flown, the coolant flow speed is slow, and even though the local pressure loss coefficient increases, this does not lead to a large increase of the pressure loss. Further, another reason is that the pipe radius of the liquid pipe 340 is smaller than that of the vapor pipe 330, and thus, for the liquid pipe 340, its process is easier, and its bending radius can be made smaller.

In this respect, however, there is a possibility that there may occur a situation in which it is difficult to cause the side face on the side of the vapor pipe 330 to align because of the restriction for the component arrangement inside the electronic device 100. In such a case, it is necessary to deal with the situation utilizing the shape of the vapor pipe 330, and in the structures of Background Art, as a result, not only the bending at angle of approximately 90 degrees, but also additional bending within the X-Y plane is carried out, and thereby the pressure loss is increased, thus causing the cooling performance to be degraded. Further, the pipe having a relatively large radius is caused to three-dimensionally bend in a complicated way, and thus, the manufacturing process becomes a process of a higher difficulty level, thereby causing tool expenses and manufacturing cost to be increased. When the curvature and the bending radius are taken into consideration, there is a possibility that the size of the cooling system may be increased.

Thus, like the present example embodiment, the X-Y cross section is also formed into the approximately circular shape, and the vapor pipe 330 is coupled to the inclined face within the Y-Z plane and the X-Y plane. In this way, the vapor pipe 330 can be drawn in a direction that approximately satisfies: (X, Y, Z)=(1, 1, 1), and just bending at one point becomes sufficient. Further, the bending angle at this time also becomes the angle of approximately 45 degrees, and thus, the pressure loss can be further reduced and the cooling performance can be further enhanced than those in Background Art.

Further, the pressure applied to the plate material of the jacket 312 of the heat receiving unit 310 is further dispersed, and thus, the pressure resistance performance can be further enhanced.

Heretofore, the preferable example embodiments of the present invention have been described, but the present invention is not limited thereto. Various modifications can be made within the scope of the present invention set forth in CLAIMS, and obviously, they are also included in the scope of the present invention.

Heretofore, the present invention has been described by handling the aforementioned example embodiments as exemplary examples. The present invention, however, is not limited to the aforementioned example embodiments. That is, various configurations understandable by those in the art can be applied to the present invention within the scope of the present invention.

REFERENCE SIGNS LIST

100 Electronic device
200 Heat generating object
300 Phase change cooling system
310 Heat receiving unit
311 Base
311A Heat receiving face
311B Heat transfer face
311C Assembly including fins or the like
312 Jacket
320 Heat dissipating unit
330 Vapor pipe
340 Liquid pipe
350 Coolant
351 Coolant liquid
352 Coolant vapor
400 Cooling fan
410 Cooling wind

The invention claimed is:

1. A phase change cooling system comprising:
a heat receiving unit; a heat dissipating unit; a vapor pipe and a liquid pipe that interconnect the heat receiving unit and the heat dissipating unit to form a loop; and coolant encapsulated inside the phase change cooling system, wherein
the heat receiving unit has a cross section selected from a group consisting of a semicircle, a circle, a semioval, an oval, and a polygon in which a portion of a side is curved,
the vapor pipe is coupled to an inclined face of the heat receiving unit, and is perpendicularly coupled to a side face of the heat dissipating unit, and a portion thereof in a vicinity of an end portion of the vapor pipe on a side of the heat dissipating unit is disposed perpendicularly to a vertical direction,
within the inclined face of the heat receiving unit, at least a portion thereof in a vicinity of a coupling portion coupled to the vapor pipe is formed into a flat face, and
a bending angle of the vapor pipe is smaller than an angle of 90 degrees.

2. A phase change cooling system comprising:
a heat receiving unit; a heat dissipating unit; a vapor pipe and a liquid pipe that interconnect the heat receiving unit and the heat dissipating unit to form a loop; and coolant encapsulated inside the phase change cooling system, wherein
the heat receiving unit has a cross section selected from a group consisting of a semioval, an oval, and a polygon in which a portion of a side is curved,
the vapor pipe is coupled to an inclined face of the heat receiving unit, and
within the inclined face of the heat receiving unit, at least a portion thereof in a vicinity of a coupling portion coupled to the vapor pipe is formed into a flat face.

3. The phase change cooling system according to claim 1, wherein the vapor pipe is perpendicularly coupled to the inclined face of the heat receiving unit, and a portion of the vapor pipe in a vicinity of an end portion on a side of the heat receiving unit is disposed obliquely to the vertical direction.

4. An electronic device comprising the phase change cooling system according to claim 1.

5. The phase change cooling system according to claim 2, wherein the vapor pipe is perpendicularly coupled to the inclined face of the heat receiving unit, and a portion in a vicinity of an end portion on a side of the heat receiving unit is disposed obliquely to a vertical direction.

6. The phase change cooling system according to claim 5, wherein the vapor pipe is perpendicularly coupled to a side face of the heat dissipating unit, and a portion in a vicinity of an end portion on a side of the heat dissipating unit is disposed perpendicularly to the vertical direction, and wherein a bending angle of the vapor pipe is smaller than an angle of 90 degrees.

7. An electronic device comprising the phase change cooling system according to claim 2.

8. The phase change cooling system according to claim 1, wherein there is a single bend in the vapor pipe between the heat receiving unit and the heat dissipating unit.

9. The phase change cooling system according to claim 2, wherein there is a single bend in the vapor pipe between the heat receiving unit and the heat dissipating unit.

\* \* \* \* \*